US011239131B2

(12) United States Patent
Wakiyama

(10) Patent No.: US 11,239,131 B2
(45) Date of Patent: Feb. 1, 2022

(54) SEMICONDUCTOR MODULE

(71) Applicant: FUJI ELECTRIC CO., LTD., Kawasaki (JP)

(72) Inventor: Tomoyuki Wakiyama, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/003,604

(22) Filed: Aug. 26, 2020

(65) Prior Publication Data
US 2021/0111092 A1 Apr. 15, 2021

(30) Foreign Application Priority Data

Oct. 15, 2019 (JP) .............................. JP2019-188629

(51) Int. Cl.
*H01L 23/367* (2006.01)
*H01L 23/498* (2006.01)

(52) U.S. Cl.
CPC ...... *H01L 23/367* (2013.01); *H01L 23/49844* (2013.01)

(58) Field of Classification Search
CPC ... H01L 23/10; H01L 23/367; H01L 23/3735; H01L 23/49844
See application file for complete search history.

(56) References Cited

U.S. PATENT DOCUMENTS

| 2015/0062824 | A1* | 3/2015 | Hyun | H01L 25/105 361/716 |
| 2016/0043009 | A1* | 2/2016 | Beyer | H01L 35/00 257/48 |
| 2016/0360620 | A1 | 12/2016 | Yamamoto et al. | |
| 2017/0221853 | A1 | 8/2017 | Yoneyama et al. | |
| 2019/0304867 | A1* | 10/2019 | Higashi | G01K 7/01 |

FOREIGN PATENT DOCUMENTS

| JP | 2003-188336 A | 7/2003 |
| JP | 2004-127983 A | 4/2004 |
| JP | 2005-039948 A | 2/2005 |
| JP | 2008-042091 A | 2/2008 |
| JP | 2017-004999 A | 1/2017 |
| JP | 2017-139304 A | 8/2017 |

OTHER PUBLICATIONS

Hiroaki Ichikawa et al., "IGBT Modules for Hybrid Vehicle Motor Driving", Fuji Electric Review, vol. 55, No. 2, p. 946-p. 50.

* cited by examiner

*Primary Examiner* — Allan R Wilson
(74) *Attorney, Agent, or Firm* — Rabin & Berdo, P.C.

(57) ABSTRACT

A semiconductor module, including a laminated substrate that has an insulating plate, a circuit board disposed on a top surface of the insulating plate, and a heat dissipation plate disposed on a bottom surface of the insulating plate. The semiconductor module further has a semiconductor element disposed on a top surface of the circuit board, a metal wiring board disposed on a top surface of the semiconductor element, and a temperature sensor that detects a temperature of the semiconductor element, and that is disposed on a top surface of the metal wiring board. The metal wiring board includes a heat blocking part that blocks heat of the semiconductor element.

8 Claims, 8 Drawing Sheets

SEMICONDUCTOR MODULE

CROSS REFERENCE TO RELATED APPLICATIONS

This application is based upon and claims the benefit of priority of the prior Japanese Patent Application No. 2019-188629, filed on Oct. 15, 2019, the entire contents of which are incorporated herein by reference.

BACKGROUND OF THE INVENTION

Field of the Invention

The present invention relates to a semiconductor module.

Description of the Related Art

A semiconductor device includes a substrate on which semiconductor elements such as an IGBT (Insulated Gate Bipolar Transistor), a power MOSFET (Metal Oxide Semiconductor Field Effect Transistor), and an FWD (Free Wheeling Diode) are provided, and it is utilized for an inverter device and the like.

The inverter device widely used for driving consumer and industrial motors is configured with semiconductor switching elements (switching elements) such as a MOSFET and an IGBT, and a driving integrated circuit (IC chip) for driving the semiconductor switching elements. Further, as a way of implementing small-size apparatus and having a protection circuit built therein, there is used an IPM (Intelligent Power Module) in which the switching elements and the IC chip described above are integrated into a single package.

In this type of semiconductor device (semiconductor module), a temperature sensor (thermistor) for detecting the temperature of semiconductor elements is provided. In Japanese Patent Laid-Open No. 2003-188336, for example, a semiconductor element and a thermistor are disposed on a circuit board in which copper circuits are formed on the surface of a metal base via an insulating layer. The semiconductor element and the thermistor are disposed on the copper circuits independent from each other, and the thermistor is connected to a gate of the semiconductor element via a bonding wire. Further, in Japanese Patent Laid-Open No. 2017-4999, a power semiconductor chip and a thermistor are disposed on a base plate. Furthermore, in Japanese Patent Laid-Open No. 2004-127983, a temperature sensor is attached on a semiconductor chip.

However, in Japanese Patent Laid-Open No. 2003-188336, the semiconductor element and the thermistor are disposed on the copper circuits independent from each other so that the positions of the semiconductor element and the thermistor are isolated. Therefore, the thermistor cannot directly catch the heat of the semiconductor element, which may affect the sensing accuracy. Further, in a case where the semiconductor element and the thermistor are disposed on the same base plate as in the case of Japanese Patent Laid-Open No. 2017-4999, there is generated a restriction in arrangement of the circuit boards on the base plate. Further, while it is possible to dispose the temperature sensor directly on the semiconductor element by considering the sensing accuracy as in the case of Japanese Patent Laid-Open No. 2004-127983, the active area of the semiconductor element is decreased for the occupied area of the temperature sensor. That is, a part of the active area of the semiconductor element is sacrificed, so that the performance of the semiconductor device may be affected.

The present invention is designed in view of the foregoing issues, and an object thereof is to provide a semiconductor module capable of increasing the detection accuracy of the temperature of the semiconductor element without affecting the original performance of the semiconductor element.

SUMMARY OF THE INVENTION

A semiconductor module according to an aspect of the present invention includes: a laminated substrate including a circuit board disposed on a top surface of an insulating plate and a heat dissipation plate disposed on a bottom surface of the insulating plate; a semiconductor element disposed on a top surface of the circuit board; a metal wiring board disposed on a top surface of the semiconductor element; and a temperature sensor that detects a temperature of the semiconductor element, the temperature sensor being disposed on a top surface of the metal wiring board, wherein the metal wiring board includes a heat blocking part that blocks heat of the semiconductor element.

According to the present invention, it is possible to increase the detection accuracy of the temperature of the semiconductor element without affecting the original performance of the semiconductor element.

DETAILED DESCRIPTION OF THE PREFERRED EMBODIMENTS

Figure 1:
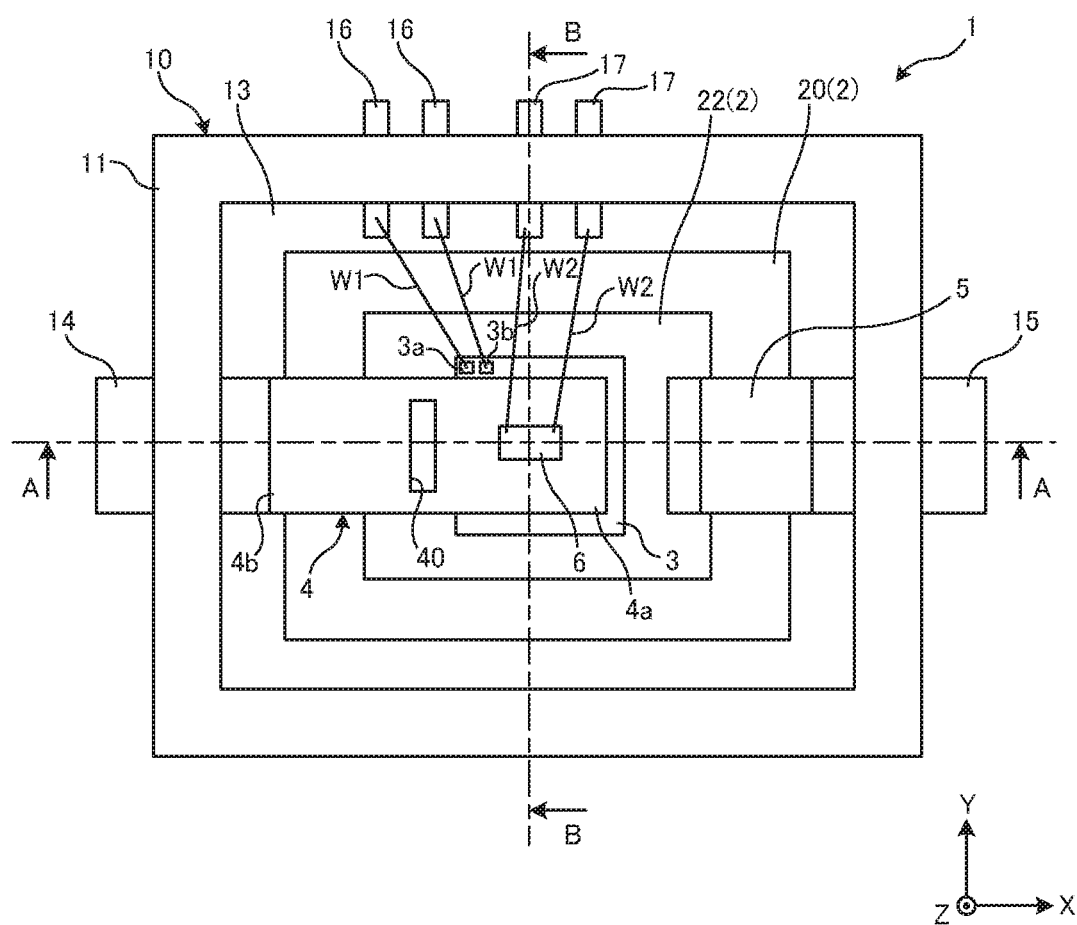
FIG. 1 is a schematic plan view illustrating an example of a semiconductor module according to an embodiment.
Figure 2:
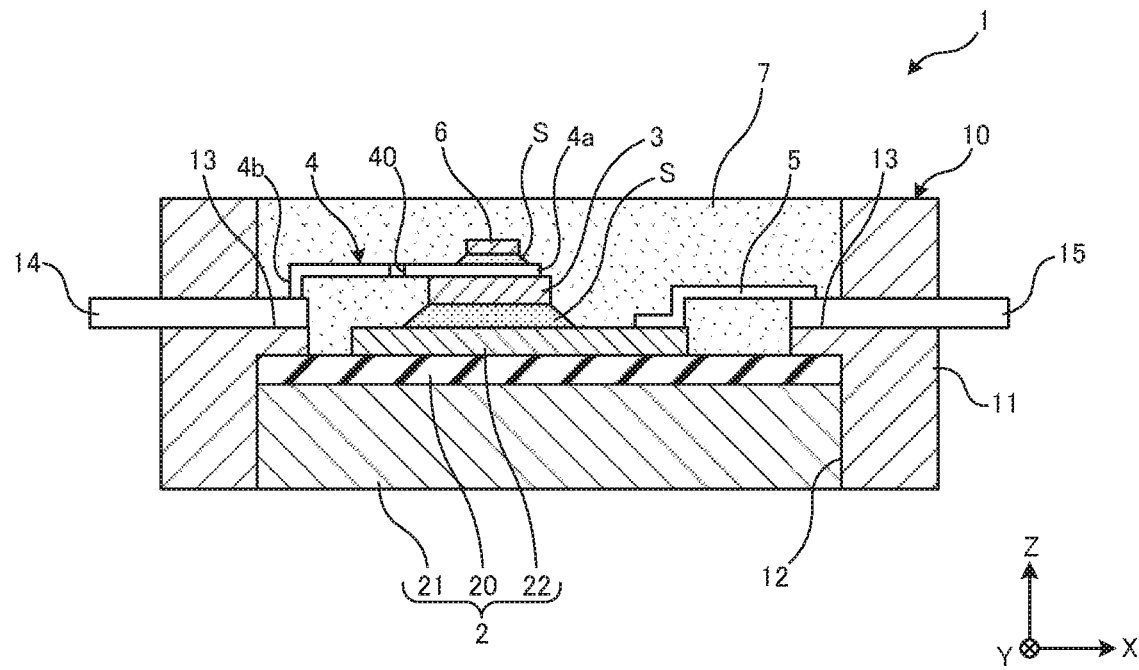
FIG. 2 is a schematic cross-sectional view taken along a line A-A of FIG. 1.
Figure 3:
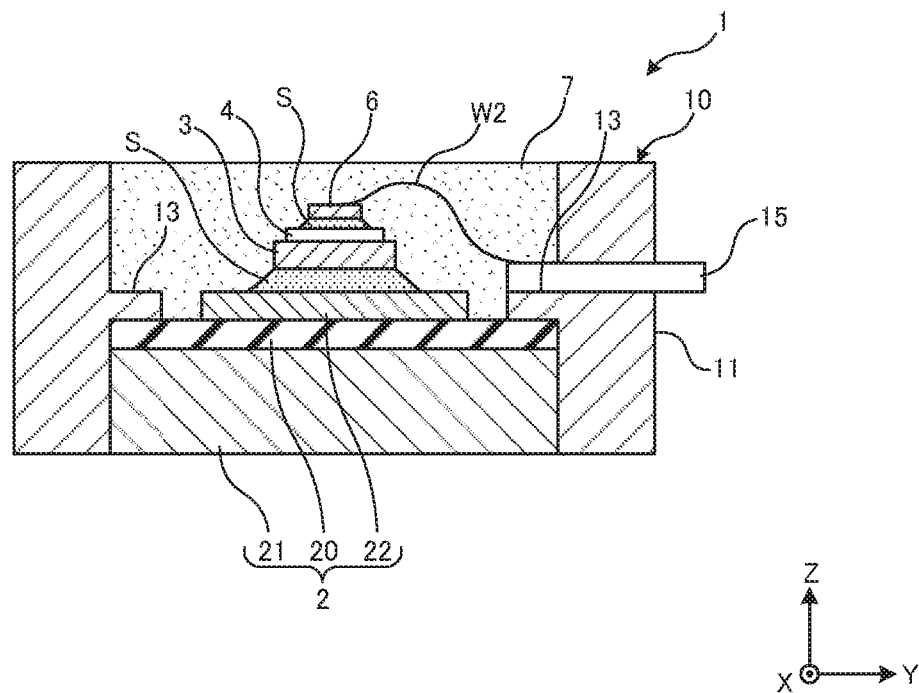
FIG. 3 is a schematic cross-sectional view taken along a line B-B of FIG. 1.

Hereinafter, a semiconductor module to which the present invention can be applied will be described. FIG. 1 is a schematic plan view illustrating an example of the semiconductor module according to an embodiment. FIG. 2 is a schematic cross-sectional view taken along a line A-A of FIG. 1. FIG. 3 is a schematic cross-sectional view taken along a line B-B of FIG. 1. Note that the semiconductor module described hereinafter is simply presented as an example, and any modifications can be applied as appropriate without being limited thereto.

Further, in the drawings referred hereinafter, the longitudinal direction (the direction to which a metal wiring board to be described later is extended from a semiconductor element) of the semiconductor module is defined as X-direction, the lateral direction (the direction orthogonal to the X-direction) is defined as Y-direction, and the height direction thereof is defined as Z-direction. Illustrated X-, Y-, and Z-axes are orthogonal to each other, and form a right-handed system. Further, in some cases, the X-direction may also be referred to as a left-and-right direction, the Y-direction may also be referred to as a front-and-back direction, and the Z-direction may also be referred to as a top-and-bottom direction. Those directions (front-and-back, left-and-right, and top-and-bottom directions) are terms used for the sake of explanations, and corresponding relations with each of the X-, Y-, and Z-directions may change depending on the installed postures of the semiconductor modules. For example, a heat-dissipation surface side (cooler side) of the semiconductor module will be referred to as a bottom surface side, and an opposite side thereof will be referred to as a top surface side. Further, in this specification, "plan view" means a case where the top surface of the semiconductor module is viewed from the positive side of the Z-direction.

A semiconductor module 1 is applied to a power conversion device such as a power module, for example. As illustrated in FIG. 1 to FIG. 3, the semiconductor module 1 is configured by disposing a laminated substrate 2, a semiconductor element 3, metal wiring boards 4, 5, a temperature sensor 6, and the like within a case member 10.

The laminated substrate 2 is formed by laminating a metal layer and an insulating layer, and configured with a DCB (Direct Copper Bonding) substrate, an AMB (Active Metal Brazing) substrate, or a metal base substrate, for example. Specifically, the laminated substrate 2 includes an insulating plate 20, a heat dissipation plate 21 disposed on a bottom surface of the insulating plate 20, and a plurality of circuit boards 22 disposed on the top surface of the insulating plate 20. The laminated substrate 2 is formed in a rectangular shape longer in the X-direction than the Y-direction on a plan view, for example.

The insulating plate 20 has a prescribed thickness in the Z-direction, and formed in a flat-plate shape having a top surface and a bottom surface. The insulating plate 20 is formed, for example, with an insulating material such as a ceramic material such as alumina ($Al_2O_3$), aluminum nitride (AlN), silicon nitride ($Si_3N_4$), a resin material such as epoxy, or an epoxy resin material using a ceramic material as a filler. Note that the insulating plate 20 may also be referred to as an insulating layer or an insulating film.

The heat dissipation plate 21 has a prescribed thickness in the Z-direction, and is formed to cover the entire bottom surface of the insulating plate 20. The heat dissipation plate 21 is formed with a metal plate with fine thermal conductivity, such as copper or aluminum, for example. The bottom surface of the heat dissipation plate 21 is a heat dissipation surface, and a cooler, not illustrated, is attached to the heat dissipation surface.

On the main surface of the insulating plate 20, a plurality of circuit boards 22 are formed in an island form (being electrically insulated from each other). Only a single circuit board 22 is illustrated in FIG. 1 for convenience. The circuit board 22 is configured with a metal layer of a prescribed thickness formed with a copper foil or the like.

On the top surface of the circuit board 22, the semiconductor element 3 is disposed via a bonding material S such as solder. The semiconductor element 3 is formed in a square shape on a plan view by a semiconductor substrate of silicon (Si), silicon carbide (SiC), or the like. In the embodiment, the semiconductor element 3 is configured with an RC (Reverse Conducting)-IGBT element in which the functions of the IGBT (Insulated Gate Bipolar Transistor) element and the FWD (Free Wheeling Diode) element are integrated.

Note, however, that the semiconductor element 3 is not limited thereto but may be configured by combining a switching element such as the IGBT or a power MOSFET (Metal Oxide Semiconductor Field Effect Transistor) and a diode such as the FWD (Free Wheeling Diode). Further, as the semiconductor element 3, an RB (Reverse Blocking)-IGBT or the like having sufficient pressure resistance for a reverse bias may be used as well. The semiconductor element 3 may be a vertical switching element and diode. Further, the shape of the semiconductor element 3, the number thereof to be disposed, the place to be disposed, and the like can be changed as appropriate.

Further, on the top surface on the outer periphery side of the laminated substrate 2, the frame-shape case member 10 is disposed. The case member 10 is formed with a synthetic resin, for example, and bonded to the top surface of the insulating plate 20 via an adhesive (not illustrated). The case member 10 has an annular wall 11 that surrounds the outer periphery of the laminated substrate 2. The annular wall 11 is formed in a square annular shape on a plan view fitted to the external shape of the laminated substrate 2.

The annular wall 11 stands toward the thickness direction (Z-direction) of the semiconductor module 1. On the bottom surface side of the annular wall 11, a recessed part 12 of a prescribed thickness with which the outer peripheral edge of the laminated substrate 2 can be engaged is formed. The recessed part 12 has the depth corresponding to the thickness of the laminated substrate 2 (total thickness of the insulating plate 20 and the heat dissipation plate 21). In a state where the laminated substrate 2 is engaged with the recessed part 12, the circuit board 22 is located inside the annular wall 11.

Further, on the inner periphery side of the top surface of the annular wall 11, a step 13 stepping down by one stage is formed. The step part 13 is formed with a square annular projected part, and provided such that the top surface (base surface) of the step part 13 comes at a lower position with respect to the top surface of the annular wall 11.

In the case member 10, terminal members are embedded by integral molding. Specifically, the terminal members are configured with main terminals 14, 15, a control terminal 16, and a temperature sensor terminal 17. Those terminal members are configured with a plate body that is formed by a metal material such as a copper material, a copper alloy material, an aluminum alloy material, or an iron alloy material.

The main terminals 14, 15 are embedded, respectively, in a pair of wall parts that are opposing to each other in the longitudinal direction (X-direction) of the annular wall 11. The terminal member on the side (left side when facing FIG. 1) that is connected to the emitter side of the semiconductor element 3 is the main terminal 14, and the terminal member on the side (right side when facing FIG. 1) that is connected to the collector side of the semiconductor element 3 via the circuit board 22 is the main terminal 15.

The main terminal 14 and the main terminal 15 are formed with a long body that is extended in the X-direction, for example. One end side of the main terminal 14 is exposed on the top surface (base surface) of the step part 13 on the inner side of the annular wall 11. The other end side of the main terminal 14 is projected to the outer side of the case member 10 through the annular wall 11. Similarly, one end side of the main terminal 15 is exposed on the top surface (base surface) of the step part 13 on the inner side of the annular wall 11. The other end side of the main terminal 15 is projected to the outer side of the case member 10 through the annular wall 11.

The control terminal 16 and the temperature sensor terminal 17 are embedded in one wall part of the annular wall 11 extended in the X-direction. The control terminal 16 and the temperature sensor terminal 17 are formed with a long body that is extended in the Y-direction, for example, a pair each of those are provided side by side in the X-direction, respectively. One end side of the control terminal 16 and the temperature sensor terminal 17 is exposed on the top surface (base surface) of the step part 13 on the inner side of the annular wall 11. The other side of the control terminal 16 and the temperature sensor terminal 17 is projected to the outer side of the case member 10 through the annular wall 11.

The semiconductor element 3 and the main terminal 14 are electrically connected by a metal wiring board 4. Further, the circuit board 22 and the main terminal 15 are electrically connected by a metal wiring board 5. The metal wiring boards 4, 5 are configured with a plate body having a top surface and a bottom surface, and formed by a metal material such as a copper material, a copper alloy material, an aluminum alloy material, or an iron alloy material. The metal wiring boards 4, 5 are formed in a prescribed shape by press working, for example. Note that the shape of the metal wiring boards 4, 5 described hereinafter is presented as an example, and any modifications can be applied as appropriate. Further, the metal wiring board may also be referred to as a lead frame.

The metal wiring board 4 has a long body lengthy in the X-direction, which is a shape bent in an L-letter shape on a side view. One end side (a first end part 4a to be described later) of the metal wiring board 4 is bonded to the top surface of the semiconductor element 3 via a bonding material (not illustrated) such as solder, for example. The top electrodes of the semiconductor element 3 to which the metal wiring board 4 is bonded are emitter and anode electrodes. In a case where the semiconductor element 3 is a MOSFET or a diode, the top electrodes may be a source electrode and an anode electrode, respectively. The bonding material may be a sintered material. The other end side (a second end part 4b to be described later) of the metal wiring board 4 is bent downward on the upper side of the main terminal 14 and bonded to the top surface of the main terminal 14. Further, the width of the metal wiring board 4 in the Y-direction is uniform from the first end part 4a to the second end part 4b.

While details are to be described later, especially the width of the first end part 4a in the Y-direction is smaller than the width of the semiconductor element 3. Note, however, that the width of the first end part 4a is not limited thereto, but may also be formed to be the same or larger than the width of the semiconductor element 3, for example, on condition that a treatment is applied such that there is no short-circuit generated in the main electrode of the semiconductor element 3 and the edge structure. Further, while FIG. 1 illustrates the case where the width of the metal wiring board 4 in the Y-direction is uniform from the first end part 4a to the second end part 4b, the width is not limited thereto. The width of the metal wiring board 4 in the Y-direction may be partially changed somewhere between the first end part 4a and the second end part 4b. This is also the same for the metal wiring board 5 presented hereinafter.

The metal wiring board 5 has a long body lengthy in the X-direction, which is a crank-like shape bent a plurality of times on a side view. One end side of the metal wiring board 5 is bonded to the top surface of the circuit board 22. The other end side of the metal wiring board 5 is bonded on the top surface of the main terminal 15. While the width of the metal wiring board 5 in the Y-direction is uniform from one end side to the other end side as described above, the width is not limited thereto but may be partially changed somewhere in the midway.

As illustrated in FIG. 1, electrode pads 3a, 3b are provided, respectively, on the top surface of the semiconductor element 3 sticking out from the metal wiring board 4. Each of the electrode pads 3a, 3b is electrically connected to the control terminal 16 via a wiring member W1.

On the top surface of the metal wiring board 4, the temperature sensor 6 is disposed via the bonding material S. In such case, it is preferable that the two electrodes of the temperature sensor 6 be isolated from each other and that the temperature sensor 6 and the metal wiring board 4 be electrically insulated by the bonding material S, for example. Further, the bonding material S for bonding the metal wiring board 4 and the temperature sensor 6 may also be an adhesive.

The temperature sensor 6 is disposed to overlap with the semiconductor element 3 on a plan view on one end side (the first end part 4a side) of the metal wiring board 4. That is, the temperature sensor 6 is located right above the semiconductor element 3. The temperature sensor 6 detects the temperature of the semiconductor element 3. Specifically, the temperature sensor 6 is configured with a thermistor. Note that the temperature sensor 6 is not limited to the thermistor but may be configured with other types of resistance thermometer or thermocouple.

The temperature sensor 6 has a sufficiently smaller area compared to that of the semiconductor element 3, and has a long shape that is lengthy in the X-direction on a plan view, for example. The temperature sensor 6 is disposed in the center in the width direction (X-direction or Y-direction) of the semiconductor element 3 (metal wiring board 4), for example. Note that the shape of the temperature sensor 6 and the place to be disposed are not limited thereto, but can be changed as appropriate.

One end side (for example, one end side in the X-direction) of the temperature sensor 6 is electrically connected to one of the temperature sensor terminals 17 via a wiring member W2. The other end side (the other end on the opposite side in the X-direction) of the temperature sensor 6 is electrically connected to the other temperature sensor terminal 17 via the wiring member W2.

As the wiring members W1, W2 described above, conductor wires (bonding wires) are used (including a wiring member W3 to be described later). As the material of the conductor wire, it is possible to use one of or a combination of gold, copper, aluminum, a gold alloy, a copper alloy, and an aluminum alloy. Further, as the wiring member, it is also possible to use a member other than the conductor wire. For example, a ribbon may be used as the wiring member.

Note that the way of taking out the electrical output of the temperature sensor 6 is not limited to the wiring method described above, but may be changed as appropriate. For example, two electrode pads corresponding to the cathode electrode and the anode electrode of the semiconductor element 3 may be formed on the metal wiring board 4. The two electrode pads are disposed in a state of being electrically independent from the metal wiring board 4. For example, it is preferable to dispose an insulating plate between each electrode pad and the lead frame. In such case, one end of the temperature sensor 6 is electrically connected to one of the electrode pads, and the other end of the temperature sensor 6 is electrically connected to the other electrode pad.

Further, into the inside space of the case member 10 defined by the annular wall 11, a sealing resin 7 is filled. Thereby, the laminated substrate 2, the semiconductor element 3, the main terminal 14, the main terminal 15, the metal wiring boards 4, 5, the temperature sensor 6, and the wiring members W1, W2 are sealed. The case member 10 demarcates the space for housing the laminated substrate 2, the semiconductor element 3, the metal wiring boards 4, 5, the temperature sensor 6, the wiring members W1, W2, and the sealing resin 7. Note that it is possible to use an epoxy resin or silicone gel for the sealing resin 7. The filling amount for the case member 10 is set as appropriate depending on the type of the sealing resin 7. For example, when the sealing resin 7 is a non-soft resin such as epoxy, the sealing resin 7 is normally filled up to the top surface of the annular wall 11. When the sealing resin 7 is a soft resin such as silicone gel, the sealing resin 7 is normally filled in a range with which the inside members are embedded.

Not limited to the configuration described above, it is also possible to employ a full-mold structure in which the case member 10 and the sealing resin 7 are integrated. In such case, the case member 10 forms the annular wall 11 of the semiconductor module and seals the laminated substrate 2, the semiconductor element 3, the main terminal 14, the main terminal 15, the metal wiring boards 4, 5, and the temperature sensor 6. Such full-mold structure can be formed by transfer molding or the like. For the case member 10 in which the sealing resin 7 is integrated, it is preferable to use the epoxy resin.

By the way, in the semiconductor module in general, it is necessary to detect the temperature of the semiconductor element in order to appropriately control the actions of the semiconductor element. As the temperature sensor for detecting the temperature of the semiconductor element, a thermistor is employed, for example. The temperature sensor is disposed on the laminated substrate having a plurality of circuit boards formed on the top surface thereof, for example. More specifically, the temperature sensor is disposed on the circuit board that is independent from the circuit board on which the semiconductor element is disposed. Further, the temperature sensor may be disposed in a prescribed area on the semiconductor element in some cases.

However, in a case where the temperature sensor is disposed on the circuit board independent from the semiconductor element, the temperature sensor and the semiconductor element are isolated. Therefore, the temperature sensor cannot directly catch the heat of the semiconductor element, which may affect the sensing accuracy. Further, in a case where the temperature sensor is disposed inside the semiconductor element, the active area of the semiconductor element is decreased for the occupied area of the temperature sensor. That is, a part of the active area of the semiconductor element is sacrificed, so that the performance of the semiconductor device may be affected.

Meanwhile, conventionally, electrical connection between the semiconductor element and the circuit board on the insulating substrate is achieved by a wiring member such as a bonding wire. Recently, instead of wiring by using a wire, there is developed a semiconductor module in which a plate-like metal wiring board structure is employed. With the metal wiring board structure, the surface area is increased so that the heat dissipation amount is increased and the chip temperature can be lowered. Further, connection is simpler compared to wiring by using the wire, thereby bringing a merit such as excellent productivity.

Therefore, the inventors of the present invention have come to design the present invention by paying attention to the point that a prescribed space is secured on the top surface of the metal wiring board when the metal wiring board is formed in a plate-like body and the metal wiring board is disposed on the top surface of the semiconductor element. In the embodiment, the temperature sensor 6 is disposed on the top surface of the metal wiring board 4 disposed on the top surface of the semiconductor element 3.

With such configuration, the temperature sensor 6 and the semiconductor element 3 can be disposed close to each other, so that the heat of the semiconductor element 3 can be easily transmitted to the temperature sensor 6 via the metal wiring board 4. Therefore, it is possible to improve the detection accuracy of the temperature sensor 6 with less heat loss.

However, the metal wiring board 4 is formed with a metal material of high thermal conductivity, so that it is concerned that the heat of the semiconductor element 3 may be diffused toward the main terminal 14 on the downstream side of the heat transfer direction of the metal wiring board 4 and there may generate a discrepancy between the temperatures of the semiconductor element and the temperature sensor. Thus, in the embodiment, a notch part 40 is further formed in the metal wiring board 4 as a heat blocking part for suppressing diffusion of the heat of the semiconductor element 3.

With such configuration, the heat transferred from the semiconductor element 3 to the metal wiring board 4 is blocked by the notch part 40. As a result, diffusion of the heat is suppressed, and the heat of the semiconductor element 3 stays in the periphery of the temperature sensor 6. Therefore, the temperature of the metal wiring board 4 on the semiconductor element 3 becomes close to the temperature of the semiconductor element 3, so that detection accuracy of the temperature by the temperature sensor 6 can be increased.

As described above, in the embodiment, the temperature sensor 6 is disposed on the top surface of the metal wiring board 4 so as to effectively utilize the space on the metal wiring board 4. Thereby, it becomes unnecessary to dispose the temperature sensor 6 directly on the semiconductor element 3. Thus, a part of the active area of the semiconductor element 3 is not sacrificed, and the performance of the semiconductor element 3 can be improved by optimally utilizing the active area. Further, by providing the notch part 40 in the metal wiring board 4 as the heat blocking part, diffusion of the heat in the periphery of the temperature sensor 6 can be prevented. That is, it is possible to increase the detection accuracy of the temperature of the semiconductor element 3 without affecting the original performance of the semiconductor element 3.

Figure 4:
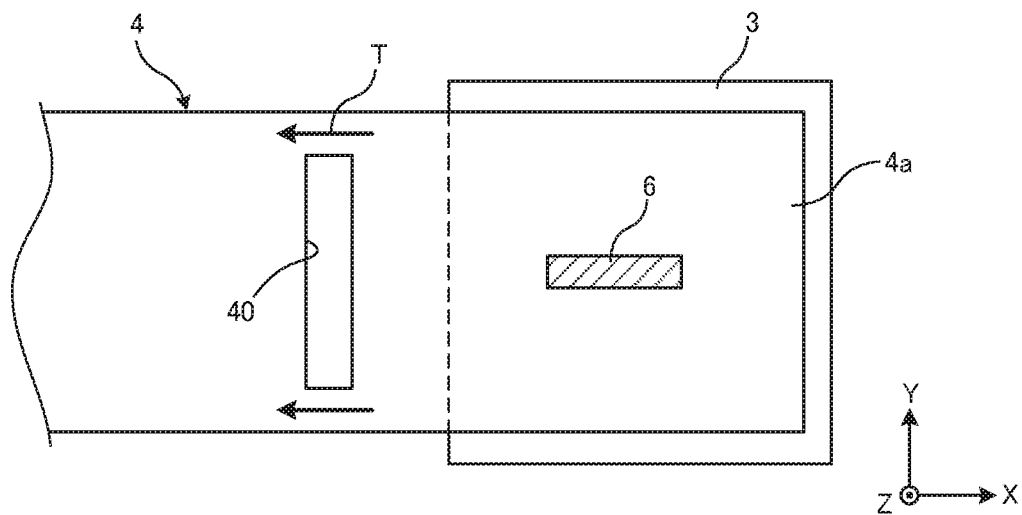
FIG. 4 is a fragmentary enlarged view illustrating a heat blocking part of FIG. 1.

Now, the specific shape and layout of the notch part 40 as the heat blocking part will be described. FIG. 4 is a fragmentary enlarged view illustrating the heat blocking part of FIG. 1. As described above, in the metal wiring board 4, the width in the Y-direction of the first end part 4a as one end side is smaller than the width in the Y-direction of the semiconductor element 3. As illustrated in FIG. 1 to FIG. 4, the notch part 40 is formed with a rectangular hole extended in the Y-direction opened through the metal wiring board 4 in the thickness direction (Z-direction). At least a part of the notch part 40 is disposed on the downstream side in the heat transfer direction with respect to the temperature sensor 6.

The downstream side of the heat transfer direction means the downstream side of the direction (direction of arrow T in FIG. 4) to which the heat of the semiconductor element 3 as a heat generating source transfers along the extending direction of the metal wiring board 4. In other words, the heat transfer direction indicates the direction from the first end part 4a of the metal wiring board 4 toward the second end part 4b. As described above, the first end part 4a is located right above the semiconductor element 3 and bonded to the semiconductor element 3 via a bonding material (not illustrated). The second end part 4b is located on the opposite side of the first end part 4a with the notch part 40 interposed therebetween. In the embodiment, the direction (negative side of the X-direction) from the semiconductor element 3 toward the main terminal 14 is the heat transfer direction. The heat transfer direction is not limited to the case described above, but it is a concept that may be changed as appropriate according to the shapes of the metal wiring board 4 and the notch part 40, the places to be disposed, and the like. Further, in FIG. 1 to FIG. 4, while the temperature sensor 6 is disposed not to overlap with the semiconductor element 3 on a plan view, the notch part 40 is disposed not to overlap with the semiconductor element 3 on a plan view on the downstream side of the heat transfer direction with respect to the temperature sensor 6.

Further, in FIG. 4, the notch part 40 is in a reed-like shape, and formed to have a narrower width than the width of the metal wiring board 4 in the Y-direction to leave out both end parts of the metal wiring board 4 in the width direction (Y-direction). In this manner, the notch part 40 is formed to block a part of the heat transfer path of the semiconductor element 3.

By disposing the notch part 40 on the downstream side of the heat transfer direction with respect to the temperature sensor 6, it is possible to prevent diffusion of the heat by allowing the heat transferred from the semiconductor element 3 to the metal wiring board 4 to stay in the periphery of the temperature sensor 6 on the upstream side of the heat transfer direction with respect to the notch part 40, that is, in the vicinity of the temperature sensor 6 and the semiconductor element 3. Thereby, the temperature sensor 6 can detect the temperature of the metal wiring board 4 close to the temperature of the semiconductor element 3, so that the detection accuracy thereof can be increased.

Further, the notch part 40 is formed to leave out the both end parts of the metal wiring board 4. That is, the notch part 40 is formed not to shut the entire heat transfer path in the width direction of the metal wiring board 4 but to block only a part of the heat transfer path and leave out the other part. Therefore, while having the heat kept in the periphery of the temperature sensor 6, it is possible to prevent overheating of the semiconductor element 3 by releasing a part of the heat toward the downstream side of the heat transfer direction with respect to the notch part 40. That is, the arrow T of FIG. 4 denotes a heat transfer path T of the remained other part. While details are to be described later, the width of the notch part 40 is preferable to be set in a range with which the heat dissipation property of the semiconductor element 3 is not disturbed while the detection accuracy of the temperature by the temperature sensor 6 is improved. Further, the heat transfer path indicates the path through which the heat generated in the semiconductor element 3 by drive of the module transfers in the metal wiring board 4. In FIG. 4, the notch part 4 is formed to extend in the direction (Y-direction) intersecting with the direction (X-direction) from the first end part 4a to which the semiconductor element 3 is bonded toward the second end part 4b. Note that the notch part 40 may be extended not in the direction orthogonal to the X-direction but in a different direction.

Figure 5:
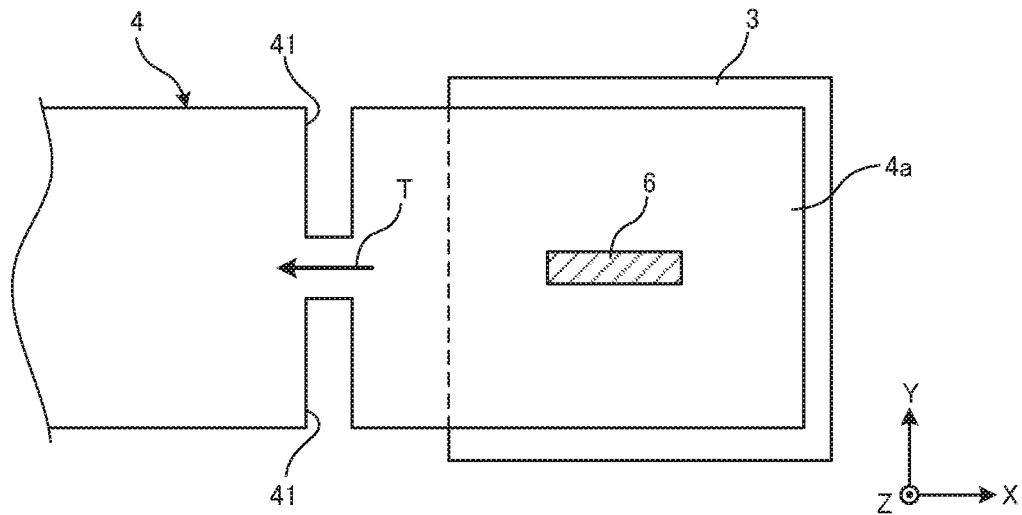
FIG. 5 is a schematic plan view illustrating a heat blocking part according to a modification example.
Figure 6:
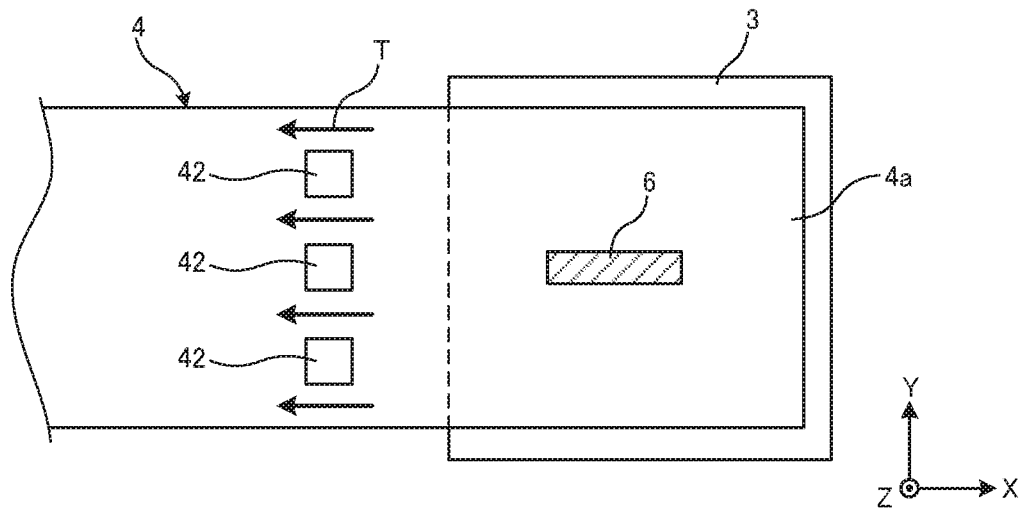
FIG. 6 is a schematic plan view illustrating a heat blocking part according to another modification example.

While the case where the notch part 40 is formed by leaving out the both end parts of the metal wiring board 4 is described in the embodiment, the configuration is not limited thereto. For example, it is also possible to employ the configurations illustrated in FIG. 5 and FIG. 6. FIG. 5 is a schematic plan view illustrating a heat blocking part according to a modification example. FIG. 6 is a schematic plan view illustrating a heat blocking part according to another modification example.

In the modification example illustrated in FIG. 5, a pair of notch parts 41 extended in the Y-direction are formed in the metal wiring board 4. The pair of notch parts 41 are disposed not to overlap with the semiconductor element 3 on a plan view on the downstream side of the heat transfer direction with respect to the temperature sensor 6. Further, the pair of notch parts 41 are formed to extend from the end of the metal wiring board 4 in the Y-direction toward the center by leaving out the center part of the metal wiring board 4. That is, the pair of notch parts 41 are counter-disposed in the Y-direction. Thereby, the heat transfer path T of a prescribed width is formed in the center of the metal wiring board 4 in the Y-direction. With such configuration, it is also possible to acquire the similar effect as that of FIG. 4.

Further, in the modification example illustrated in FIG. 6, a plurality of notch parts 42 disposed intermittently side by side in the Y-direction are formed in the metal wiring board 4. The plurality of notch parts 42 are disposed not to overlap with the semiconductor element 3 on a plan view on the downstream side of the heat transfer direction with respect to the temperature sensor 6. The heat transfer path T of a prescribed width is formed between the two notch parts 42 neighboring to each other in the Y-direction. Note that the number of the notch parts 42 can be changed as appropriate. With such configuration, it is also possible to acquire the similar effect as that of FIG. 4 and FIG. 5. Each of the plurality of notch parts 42 may be a rectangular hole on a plan view or may also be a circular hole.

Note that the width of the heat transfer path T illustrated in FIG. 4 to FIG. 6 is preferable to be in a range with which the conductivity on the metal wiring board 4 can be secured. That is, the heat transfer path T is the heat dissipation path of the semiconductor element 3 and, at the same time, is also a current path through which the current flows on the metal wiring board 4.

Figure 7A:
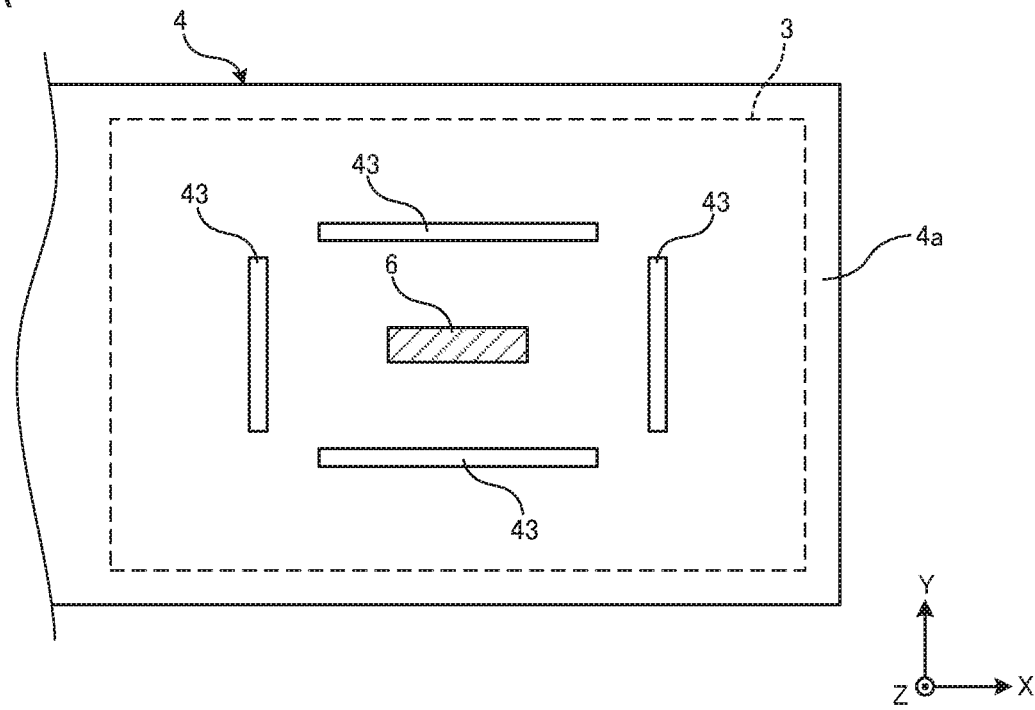
FIG. 7A and FIG. 7B are schematic plan views illustrating variations of arrangement examples of the heat blocking part.
Figure 7B:
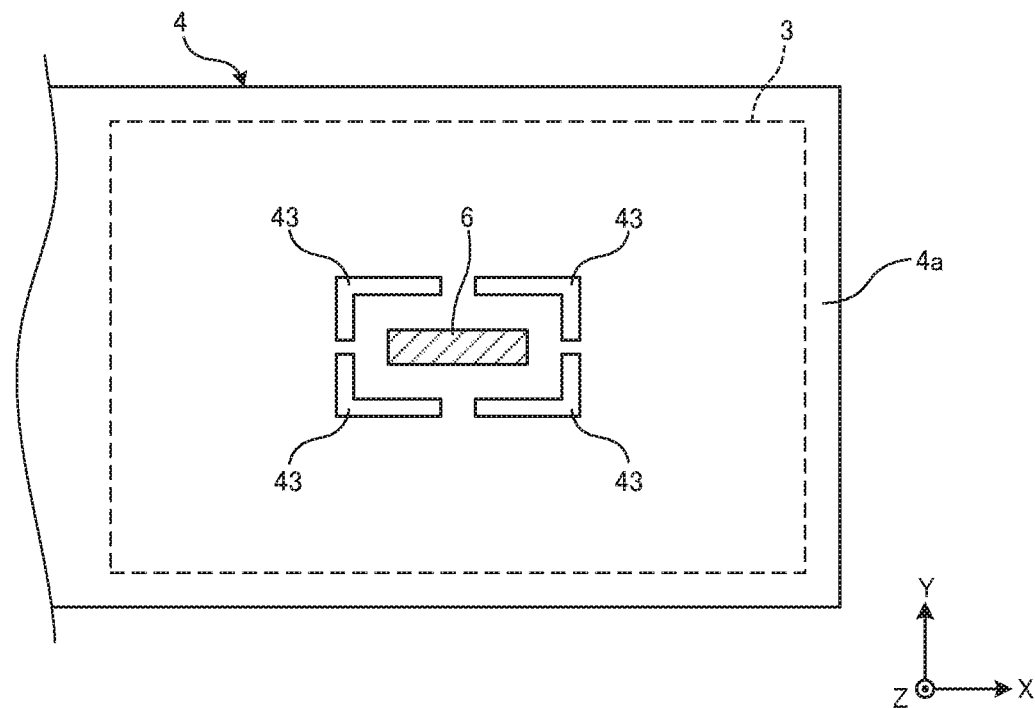

Further, while the cases where the notch parts 40 to 42 as the heat blocking parts are disposed not to overlap with the semiconductor element 3 on a plan view are described in the examples illustrated in FIG. 4 to FIG. 6, the configurations are not limited thereto. Further, while the case where the width of the metal wiring board 4 in the Y-direction is smaller than the width of the semiconductor element 3 in the Y-direction is described in the above examples, the configuration is not limited thereto. For example, the configurations illustrated in FIG. 7 may be employed. FIG. 7 (FIG. 7A and FIG. 7B) are schematic plan views illustrating variations of the arrangement examples of the heat blocking part.

As illustrated in FIG. 7A and FIG. 7B, the width of the metal wiring board 4 in the Y-direction is larger than the width of the semiconductor element 3 in the Y-direction. Further, on the metal wiring board 4, a plurality of notch parts 43 are formed to surround the periphery of the temperature sensor 6. The plurality of notch parts 43 are disposed to overlap with the semiconductor element 3 on a plan view. Each of the notch parts 43 may be formed with a long-shape through-hole extended in a prescribed direction as in FIG. 7A or may be formed with a through-hole of L-letter shape on a plan view as illustrated in FIG. 7B. By surrounding the temperature sensor 6 with the plurality of notch parts 43, the heat is likely to stay in the periphery of the temperature sensor 6 so that the detection accuracy of the temperature by the temperature sensor 6 can be increased. While the cases where the plurality of notch parts 43 are formed to surround the periphery of the temperature sensor 6, that is, the case where the plurality of notch parts 43 are intermittently formed, are described in FIG. 7, the configurations are not limited thereto. The notch part 43 may be formed in a continuous annular shape to surround the periphery of the temperature sensor 6. That is, in FIG. 7, "to surround the periphery of the temperature sensor 6" is a concept that can include not only a mode that surrounds the periphery of the temperature sensor 6 with the continuously formed annular notch part 43 but also a mode that surrounds the periphery of the temperature sensor 6 with the plurality of notch parts 43 formed intermittently. Therefore, the temperature sensor 6 may not need to be thoroughly surrounded by the notch part 43 but may be surrounded at least in a part thereof. Further, in the cases of FIG. 7, at least a part of the plurality of notch parts 43 is located on the downstream side of the heat transfer direction (downstream side of the direction from the first end part 4a toward the second end part 4b) with respect to the temperature sensor 6.

Further, in the embodiment described above, the width of the notch part 40 is preferable to be set in a range with which the heat dissipation property of the semiconductor element 3 is not disturbed while the detection accuracy of the temperature by the temperature sensor 6 is improved. Now, a width D1 of the notch part 40 as well as a distance D2 between the notch part 40 and the temperature sensor 6 will be described by referring to FIG. 8. FIG. 8 are schematic views illustrating the positional relation between the temperature sensor and the heat blocking part. Specifically, FIG. 8A is a schematic plan view of the periphery of the heat blocking part, and FIG. 8B is a schematic cross-sectional view of the periphery of the heat blocking part.

Figure 8A:
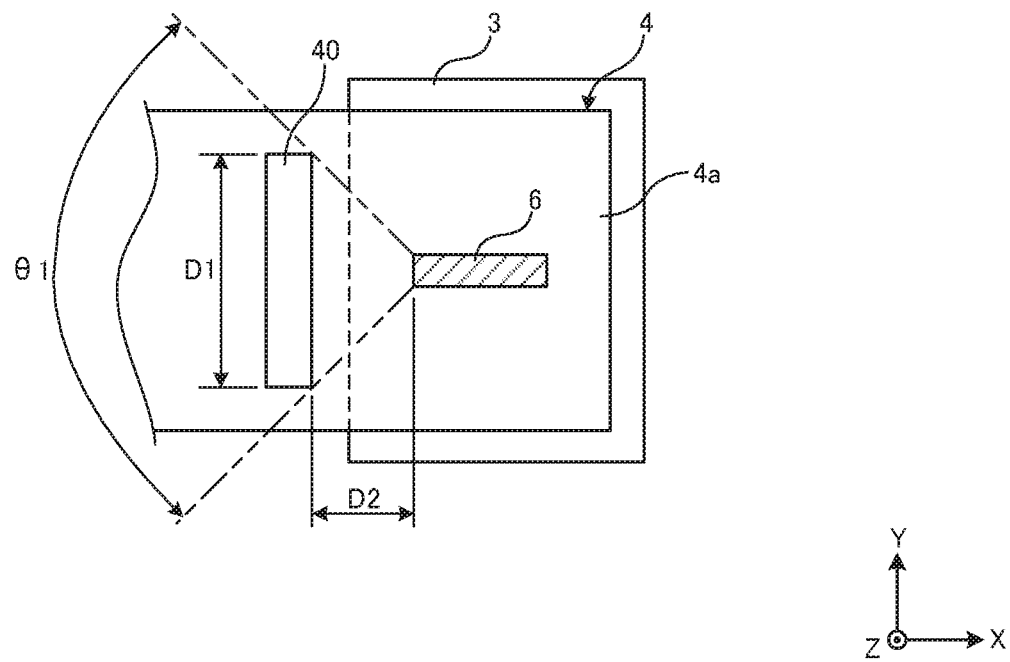
FIG. 8A and FIG. 8B are schematic view illustrating a positional relation of a temperature sensor and the heat blocking part.
Figure 8B:
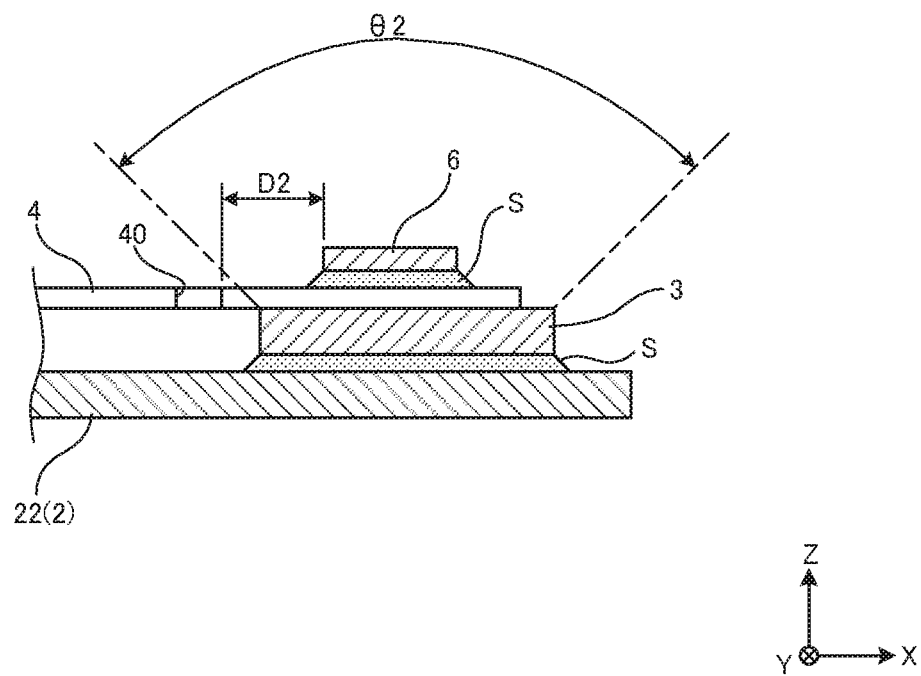

As illustrated in FIG. 8A and FIG. 8B, the heat generated in the semiconductor element 3 has a prescribed diffusing range. For example, on a plan view illustrated in FIG. 8A, the heat transferred from the semiconductor element 3 to the temperature sensor 6 via the metal wiring board 4, that is, the heat of the semiconductor element 3 passed through the temperature sensor 6, tends to diffuse in a prescribed angle range θ1 from the end parts on the side closer to the notch part 40. The angle range θ1 is 90 degrees, for example.

In this case, the width D1 of the notch part 40 is preferable to be equal to or larger than the angle range θ1 from the temperature sensor 6 side. With such configuration, it is possible to effectively increase the detection accuracy of the temperature by suppressing diffusion of the heat of the temperature sensor 6 while allowing diffusion of the heat of the semiconductor element 3. Note that the width D1 of the notch part 40 may be set to fall within the angle range θ1 by giving priority to diffusion of the heat of the semiconductor element 3 over the detection accuracy of the temperature by the temperature sensor 6.

In this case, when the width D1 of the notch part 40 is extremely smaller than the angle range θ1, it becomes insufficient to block the heat. In the meantime, when the width D1 of the notch part 40 is equal to or larger than the angle range θ1 and too close to the width of the metal wiring board 4 in the Y-direction, it is concerned that the heat may be blocked more than it is necessary for sensing and heat dissipation may also be disturbed. Therefore, the width D1 of the notch part 40 is preferable to be set in a range with which both the detection accuracy of the temperature by the temperature sensor 6 and diffusion of the heat of the semiconductor element 3 described above can be achieved.

Further, on the cross-sectional view illustrated in FIG. 8B, the heat of the semiconductor element 3 tends to diffuse in a prescribed angle range θ2 toward the upper side with respect to the metal wiring board 4 disposed on the top surface side. The angle range θ2 is 90 degrees, for example.

In this case, the opposing space (distance D2) between the notch part 40 and the temperature sensor 6 is preferable to be set such that the notch part 40 is disposed on the outer side than the angle range θ2. With such configuration, it is possible to effectively increase the detection accuracy of the temperature by suppressing diffusion of the heat passed through the temperature sensor 6 while allowing diffusion of the heat of the semiconductor element 3. Note that the notch part 40 may be disposed to fall within the angle range θ2 by giving priority to prevention of diffusion of the heat passed through the temperature sensor 6 over heat dissipation of the semiconductor element 3.

Figure 9:
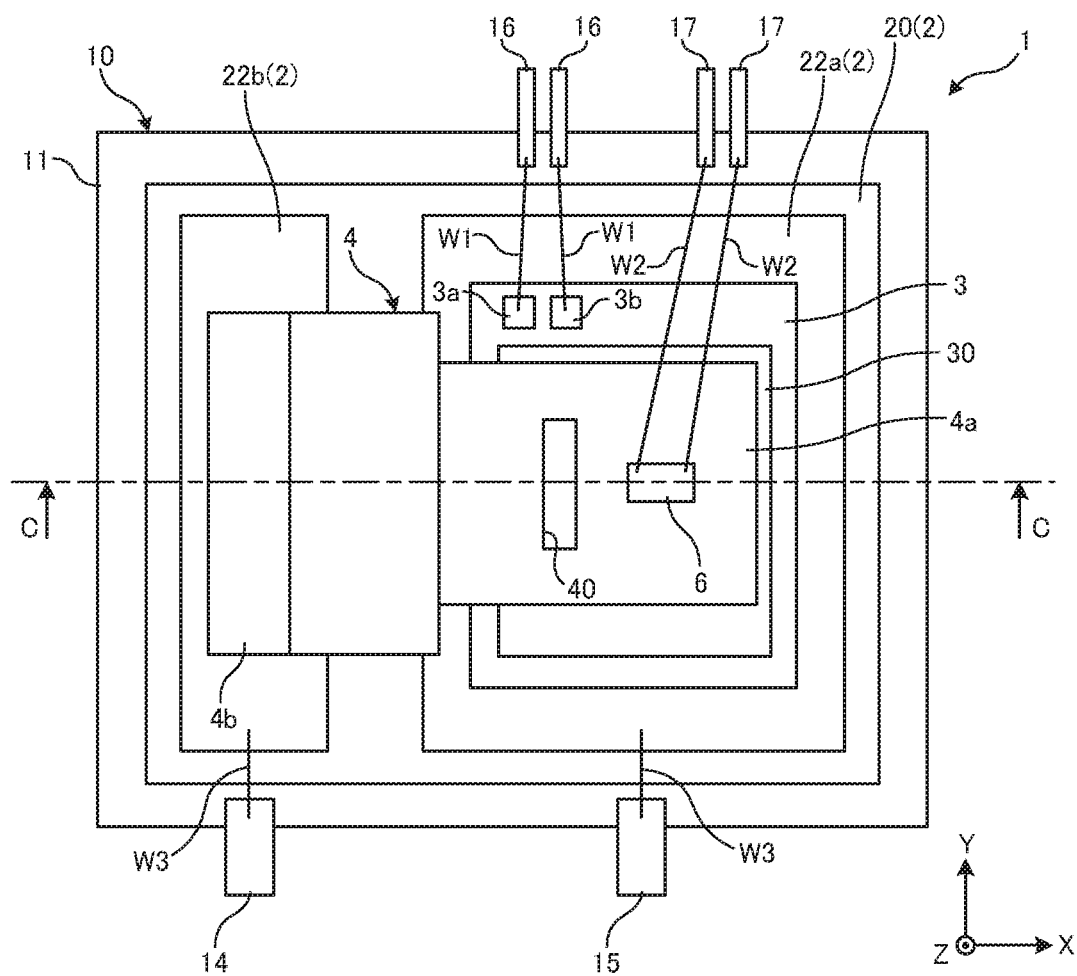
FIG. 9 is a schematic plan view illustrating a semiconductor module according to another example of the embodiment.
Figure 10:
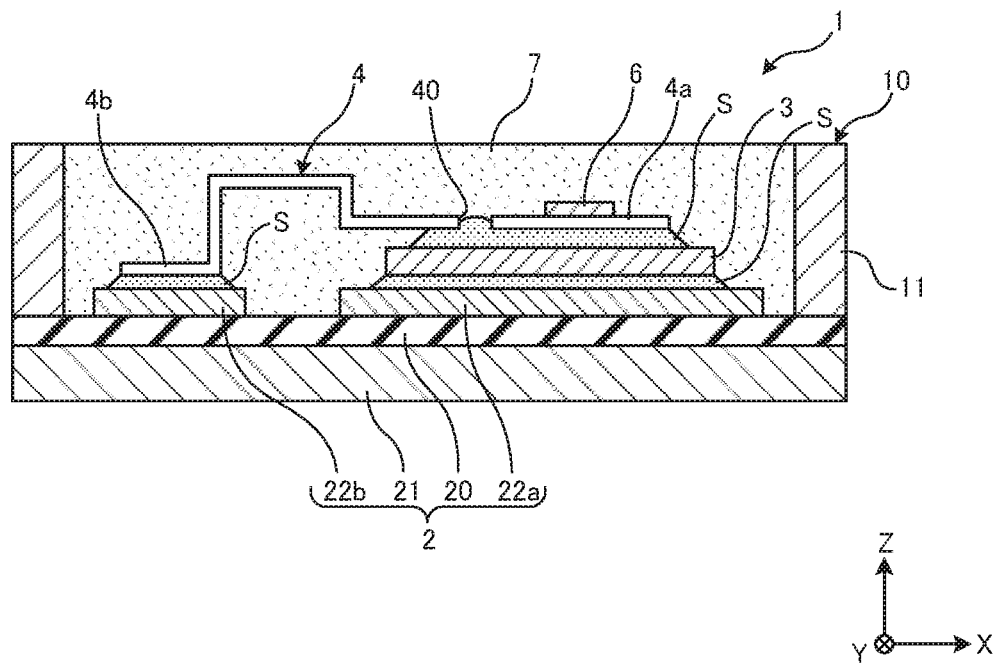
FIG. 10 is a schematic cross-sectional view taken along a line C-C of FIG. 9.
Figure 11:
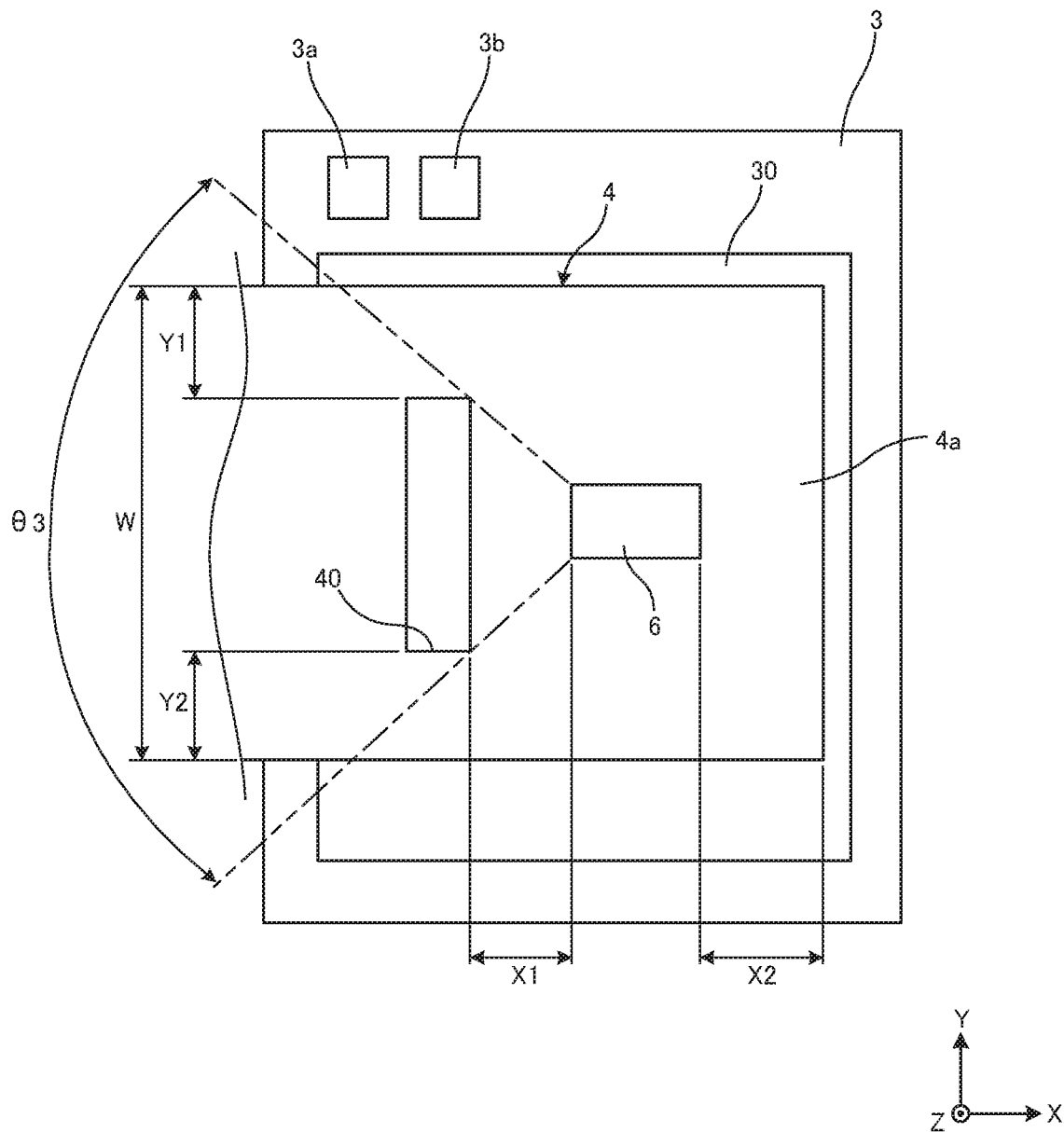
FIG. 11 is a fragmentary enlarged view illustrating the heat blocking part of FIG. 9.

Next, a semiconductor module according to another example will be described by referring to FIG. 9 to FIG. 11. FIG. 9 is a schematic plan view illustrating the semiconductor module according to another example of the embodiment. FIG. 10 is a schematic cross-sectional view taken along a line C-C of FIG. 9. FIG. 11 is a fragmentary enlarged view illustrating the heat blocking part of FIG. 9. In the mode of FIG. 9 to FIG. 11, layout of the circuit boards and a part of the terminal members are different and also a part of the shape of the metal wiring board is different with respect to those of the semiconductor module illustrated in FIG. 1 to FIG. 4. Therefore, only the major different points will be described, and same reference signs are applied to the common components and explanations thereof are omitted as appropriate.

In the semiconductor module 1 illustrated in FIG. 9 to FIG. 11, two circuit boards 22a and 22b are formed in an island form on the main surface of the insulating plate 20. The two circuit boards 22a and 22b have a rectangular shape lengthy in the Y-direction, and are disposed side by side in the X-direction. On the top surface of the circuit board 22a, the semiconductor element 3 is disposed via the bonding material S. On the top surface of the semiconductor element 3, a rectangular main electrode 30 slightly smaller than the external shape of the semiconductor element 3 is formed. Further, on the top surface of the semiconductor element 3, electrode pads 3a and 3c are formed on the outer side of the main electrode 30.

On the top surface of the semiconductor element 3, the metal wiring board 4 is disposed. The metal wiring board 4 is a long body extended in the X-direction to be placed over the two circuit boards 22a and 22b on a plan view, and has a crank-like shape bent a plurality of times on a side view. One end side (the first end part 4a) of the metal wiring board 4 is electrically bonded to the top surface of the main electrode 30 of the semiconductor element 3 via the bonding material S such as solder. The other end side (the second end part 4b) of the metal wiring board 4 is electrically bonded to the top surface of the circuit board 22b via the bonding material S such as solder. The metal wiring board 4 on a plan view is formed such that the width of the first end part 4a in the Y-direction is smaller than the width of the semiconductor element 3 (main electrode 30) in the Y-direction and that the width of the second end part 4b in the Y-direction is larger than the width of the first end part 4a.

On the top surface of the metal wiring board 4 on the first end part 4a side, the notch part 40 opened through the thickness direction is formed. The notch part 40 has a long shape extended in the Y-direction, and is disposed right above the semiconductor element 3 (main electrode 30). Further, on the top surface of the metal wiring board 4 on the first end part 4a side, the temperature sensor 6 is disposed via a bonding material (not illustrated). The notch part 40 and the temperature sensor 6 are disposed to overlap with the semiconductor element 3 (main electrode 30) on a plan view. Further, the notch part 40 is disposed on the downstream side with respect to the temperature sensor 6 in the direction from the first end part 4a of the metal wiring board 4 toward the second end part 4b.

Specifically, at least a part of the notch part 40 is filled with the bonding material S, and the top surface of the bonding material S forms a fillet shape (see FIG. 10). With such configuration, the notch part 40 is disposed on the downstream side of the heat transfer direction with respect to the temperature sensor 6, and the thermal conductivity of the bonding material S (solder) filled in the notch part 40 is smaller than the thermal conductivity of the metal wiring board 4. Therefore, it is possible to acquire the effect of blocking the heat generated from the semiconductor element 3 located directly under the temperature sensor 6. That is, the notch part 40 and the bonding material S inserted into the notch part 40 function as the heat blocking part.

Further, as illustrated in FIG. 11, the width of the metal wiring board 4 in the Y-direction is defined as a width W, and distances from both end parts of the metal wiring board 4 in the Y-direction to the end part of the notch part 40 are defined as Y1, Y2, respectively. Further, the opposing space between the notch part 40 and the temperature sensor 6 is defined as X1, and the distance from the first end part 4a of the metal wiring board 4 to one end part of the temperature sensor 6 is defined as X2. Further, the angle formed by a pair of straight lines connecting the end parts of the temperature sensor 6 on the negative side of the X-direction and the end parts of the notch part 40 is defined as θ3. In this case, it is preferable to satisfy X1≤X2, 85°≤θ3≤95°, Y1≥X1, and Y2≥X1. Those ranges indicate the ranges with which both the detection accuracy of the temperature by the temperature sensor 6 and diffusion of the heat of the semiconductor element 3 can be achieved when setting the dimension of the notch part 40 and the place to be disposed.

Figure 12A:
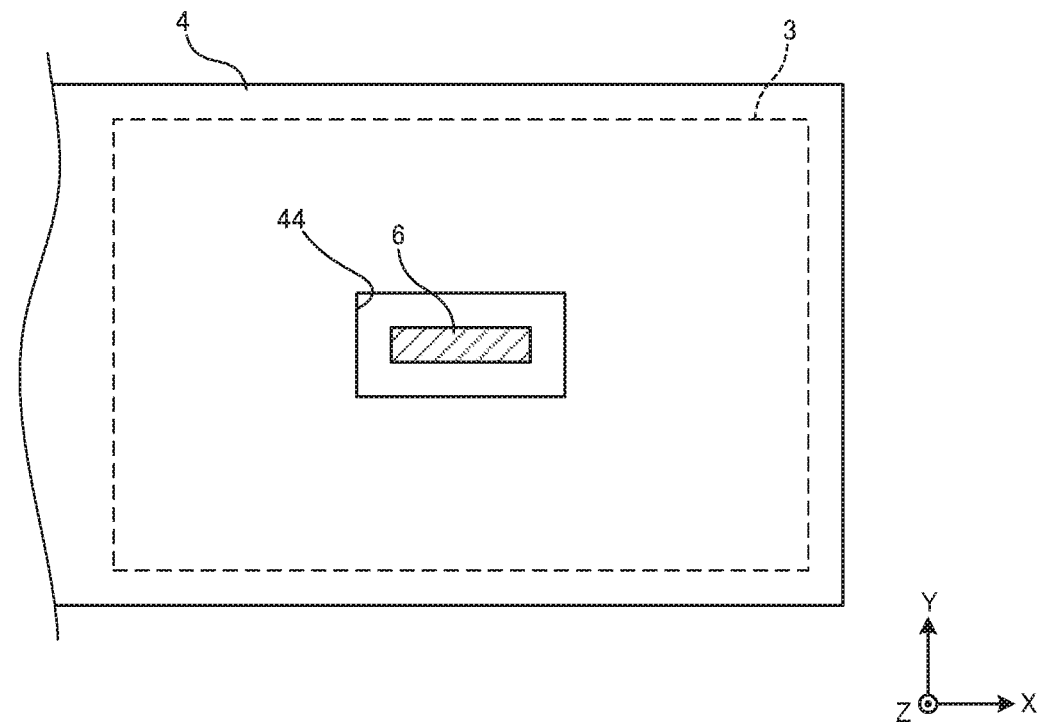
FIG. 12A and FIG. 12B are schematic views illustrating a semiconductor module according to another embodiment.
Figure 12B:
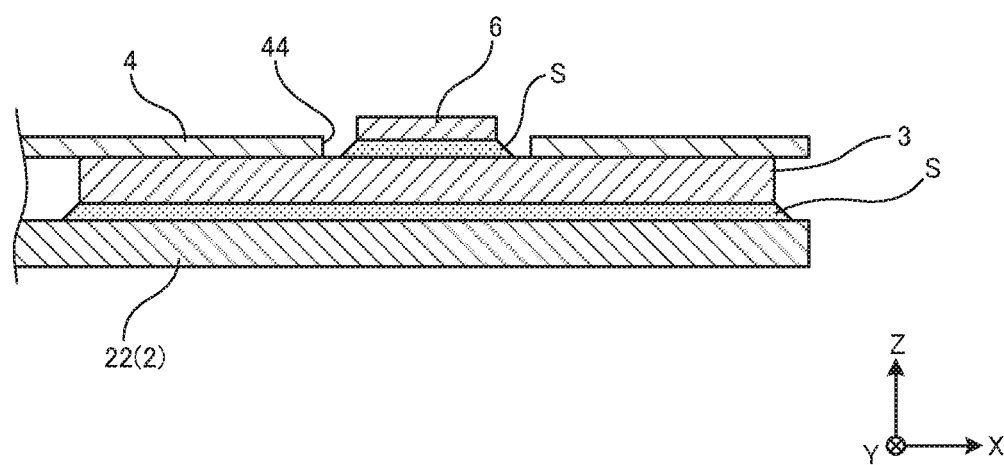

Next, another embodiment will be described by referring to FIG. 12. FIG. 12 are schematic views illustrating a semiconductor module according to another embodiment.

In the examples of FIG. 1 to FIG. 11, the cases where the temperature sensor 6 is disposed on the top surface of the metal wiring board 4 are described. In the meantime, in the example illustrated in FIG. 12, a notch part 44 (opening) as a heat blocking part is formed in the metal wiring board 4 at a place corresponding to the temperature sensor 6. The notch part 44 has a larger area than that of the temperature sensor 6. The temperature sensor 6 is directly bonded to the semiconductor element 3 via the bonding material S within the notch part 44.

With such configuration, the temperature sensor 6 is directly bonded to the semiconductor element 3, so that the temperature sensor 6 can directly catch the heat of the semiconductor element 3. Therefore, it is possible to increase the detection accuracy of the temperature by the temperature sensor 6. Further, since the notch part 44 larger than the temperature sensor 6 is formed in the metal wiring board 4 by corresponding to the temperature sensor 6, there is no direct contact between the temperature sensor 6 and the metal wiring board 4. Thus, it is possible to prevent the heat transferred from the semiconductor element 3 to the temperature sensor 6 from diffusing to the metal wiring board 4. Thus, as in the case described above, the detection accuracy of the temperature by the temperature sensor 6 can be increased still more.

As described above, according to the present invention, it is possible to increase the detection accuracy of the temperature of the semiconductor element without affecting the original performance of the semiconductor element by blocking diffusion of the heat transferred from the semiconductor element 3 to the temperature sensor 6 via the metal wiring board with the heat blocking part.

In the embodiments described above, the number of the semiconductor elements 3 disposed on the laminated substrate 2 and the temperature sensors 6 disposed on the metal wiring board 4 and the places thereof to be disposed are not limited to the configurations described above, but may be changed as appropriate.

Further, in the embodiments described above, the number and layout of the circuit boards 22 are not limited to the configurations described above, but may be changed as appropriate.

Further, while the semiconductor element 3 is formed in a rectangular shape on a plan view in the embodiments described above, the configuration is not limited thereto. The semiconductor element 3 may be formed in a polygonal shape other than the rectangular shape.

Further, while the case where the temperature sensor 6 has a long shape lengthy in the X-direction is described in the embodiments above, the configuration is not limited thereto. The temperature sensor 6 may be a long shape lengthy in the Y-direction and, not necessarily limited to the long shape, the shape thereof and place to be disposed can be changed as appropriate.

While the embodiments and the modification examples have been described above, a combination of a whole part of or a part of the embodiments and the modification examples may be employed as another embodiment.

Further, the present invention is not limited to the embodiments and the modification examples described above, but various changes, substitutions, and modifications are possible without departing from the scope of the technical spirit. Further, as long as the technical spirit can be achieved by means of another method by a technical progress or another technique derived therefrom, such method may be used as well. Therefore, the scope of the appended claims covers all embodiments that can be included within the scope of the technical spirit.

Hereinafter, the feature points of the embodiments described above will be described.

The semiconductor module described in the embodiment includes: a laminated substrate including a circuit board disposed on a top surface of an insulating plate and a heat dissipation plate disposed on a bottom surface of the insulating plate; a semiconductor element disposed on a top surface of the circuit board; a metal wiring board disposed on a top surface of the semiconductor element; and a temperature sensor that detects a temperature of the semiconductor element, the temperature sensor being disposed on a top surface of the metal wiring board, wherein the metal wiring board includes a heat blocking part that blocks heat of the semiconductor element.

Further, in the semiconductor module described in the embodiment, the metal wiring board includes a first end part to which the semiconductor element is bonded, and a second end part located on an opposite side of the first end part; and at least a part of the heat blocking part is located on a downstream side of a direction from the first end part toward the second end part with respect to the temperature sensor.

Further, in the semiconductor module described in the embodiment, the heat blocking part is formed with a notch part that is extended toward a direction intersecting with the direction from the first end part toward the second end part.

Further, in the semiconductor module described in the embodiment, the temperature sensor is disposed to overlap with the semiconductor element on a plan view.

Further, in the semiconductor module described in the embodiment, the heat blocking part is disposed to overlap with the semiconductor element on a plan view.

Further, in the semiconductor module described in the embodiment, the heat blocking part is disposed to surround periphery of the temperature sensor.

Further, in the semiconductor module described in the embodiment, the heat blocking part is disposed within a diffusing range of the heat of the semiconductor element on a plan view.

Further, in the semiconductor module described in the embodiment, the heat blocking part is disposed outside the diffusing range of the heat of the semiconductor element on a cross-sectional view.

Further, the semiconductor module described in the embodiment includes: a laminated substrate including a circuit board disposed on a top surface of an insulating plate and a heat dissipation plate disposed on a bottom surface of the insulating plate; a semiconductor element disposed on a top surface of the circuit board; a metal wiring board disposed on a top surface of the semiconductor element; and a temperature sensor that detects a temperature of the semiconductor element, the temperature sensor being disposed on in an opening of the metal wiring board provided on the top surface of the semiconductor element.

INDUSTRIAL APPLICABILITY

As described above, the present invention exhibits an advantage of being able to increase the detection accuracy of the temperature of the semiconductor element without affecting the original performance of the semiconductor element and is effective for the semiconductor module in particular.

REFERENCE SIGNS LIST

1 Semiconductor module
2 Laminated substrate
3 Semiconductor element
3a Electrode pad
3b Electrode pad
4 Metal wiring board
4a First end part
4b Second end part
5 Metal wiring board
6 Temperature sensor
7 Sealing resin
10 Case member
11 Annular wall
12 Recessed part
13 Step part
14 Main terminal
15 Main terminal
16 Control terminal
17 Temperature sensor terminal
20 Insulating plate
21 Heat dissipation plate
22 Circuit board
40 Notch part
41 Notch part
42 Notch part
43 Notch part
44 Notch part
D1 Width of notch part
D2 Distance
S Bonding material
T Heat transfer path
θ1 Angle range
θ2 Angle range
θ3 Angle range

What is claimed is:

1. A semiconductor module, comprising:
   a laminated substrate including
      an insulating plate,
      a circuit board disposed on a top surface of the insulating plate, and
      a heat dissipation plate disposed on a bottom surface of the insulating plate;
   a semiconductor element disposed on a top surface of the circuit board;
   a metal wiring board disposed on a top surface of the semiconductor element; and
   a temperature sensor that detects a temperature of the semiconductor element, the temperature sensor being disposed on a top surface of the metal wiring board, wherein
   the metal wiring board includes a heat blocking part that blocks heat of the semiconductor element.

2. The semiconductor module according to claim 1, wherein:
   the metal wiring board includes a first end part to which the semiconductor element is bonded, and a second end part located on an opposite side of the first end part; and
   at least a part of the heat blocking part is located downstream from the temperature sensor, with respect to a first direction from the first end part to the second end part.

3. The semiconductor module according to claim 2, wherein the heat blocking part is formed with a notch part that extends in a second direction perpendicular to the first direction.

4. The semiconductor module according to claim 1, wherein the temperature sensor is disposed to overlap the semiconductor element in a plan view of the semiconductor module.

5. The semiconductor module according to claim 4, wherein the heat blocking part is disposed to overlap the semiconductor element in the plan view of the semiconductor module.

6. The semiconductor module according to claim 5, wherein the heat blocking part is disposed to surround a periphery of the temperature sensor.

7. The semiconductor module according to claim 1, wherein the heat blocking part is disposed within a diffusing range of the heat of the semiconductor element in a plan view of the semiconductor module.

8. The semiconductor module according to claim 7, wherein the heat blocking part is disposed outside the diffusing range of the heat of the semiconductor element in a cross-sectional view of the semiconductor module.

* * * * *